US011169183B2

(12) United States Patent
Nakagawa et al.

(10) Patent No.: US 11,169,183 B2
(45) Date of Patent: Nov. 9, 2021

(54) CURRENT SENSOR

(71) Applicant: AISIN SEIKI KABUSHIKI KAISHA, Kariya (JP)

(72) Inventors: Daisuke Nakagawa, Kariya (JP); Koki Sugihara, Kariya (JP); Toshiro Nagashima, Kariya (JP)

(73) Assignee: AISIN CORPORATION, Kariya (JP)

( * ) Notice: Subject to any disclaimer, the term of this patent is extended or adjusted under 35 U.S.C. 154(b) by 29 days.

(21) Appl. No.: 16/688,135

(22) Filed: Nov. 19, 2019

(65) Prior Publication Data

US 2020/0158758 A1 May 21, 2020

(30) Foreign Application Priority Data

Nov. 19, 2018 (JP) .............................. JP2018-216815

(51) Int. Cl.
*G01R 15/14* (2006.01)
*G01R 19/00* (2006.01)
*G01R 15/20* (2006.01)
*G01R 1/20* (2006.01)

(52) U.S. Cl.
CPC ......... *G01R 15/146* (2013.01); *G01R 15/207* (2013.01); *G01R 19/0092* (2013.01); *G01R 1/20* (2013.01)

(58) Field of Classification Search
CPC .. G01R 15/146; G01R 15/207; G01R 15/205; G01R 15/00; G01R 19/0092
See application file for complete search history.

(56) References Cited

U.S. PATENT DOCUMENTS

| 8,237,435 B2 | 8/2012 | Hashio et al. | |
|---|---|---|---|
| 2011/0050219 A1* | 3/2011 | Krella | H05K 7/1432 324/251 |
| 2014/0084914 A1* | 3/2014 | Nakajima | G01R 15/207 324/252 |

(Continued)

FOREIGN PATENT DOCUMENTS

| JP | 2007147565 A | 6/2007 |
|---|---|---|
| JP | 5414333 B2 | 11/2013 |

(Continued)

*Primary Examiner* — Dominic E Hawkins
(74) *Attorney, Agent, or Firm* — Buchanan Ingersoll & Rooney PC

(57) ABSTRACT

A current sensor includes a bus bar, a magnetic core, and a casing. The bus bar includes a plate-shaped portion. The magnetic core surrounds the plate-shaped portion. The casing houses the bus bar and magnetic core. A thickness direction of the magnetic core is along a longitudinal direction of the plate-shaped portion. The casing includes lower and upper casings. The lower casing includes first and second press-fit portions. The first press-fit portion includes a groove portion into which the plate-shaped portion is press-fitted. In a state where the magnetic core is inserted downward into the second press-fit portion, both-side portions of the magnetic core in a width direction are press-fitted and held by the second press-fit portion. The upper casing includes a pressing portion that presses the bus bar and magnetic core downward. The groove portion is recessed downward, and is along a thickness direction of the magnetic core.

8 Claims, 7 Drawing Sheets

(56) References Cited

U.S. PATENT DOCUMENTS

| | | | | |
|---|---|---|---|---|
| 2014/0091788 A1* | 4/2014 | Misaki | ............... | G01R 19/0092 |
| | | | | 324/253 |
| 2014/0225593 A1* | 8/2014 | Nakajima | ............... | G01R 15/20 |
| | | | | 324/117 R |
| 2014/0312892 A1* | 10/2014 | Lenhard | ................. | G01R 33/02 |
| | | | | 324/244 |
| 2015/0042324 A1* | 2/2015 | Fujita | ..................... | G01R 15/20 |
| | | | | 324/244 |
| 2017/0370968 A1 | 12/2017 | Okumura et al. | | |

FOREIGN PATENT DOCUMENTS

| | | | |
|---|---|---|---|
| JP | 5690209 B2 | 2/2015 | |
| JP | 2017044486 A | 3/2017 | |
| JP | 2018004269 A | 1/2018 | |

* cited by examiner

CURRENT SENSOR

CROSS REFERENCE TO RELATED APPLICATIONS

This application is based on and claims priority under 35 U.S.C. § 119 to Japanese Patent Application No. 2018-216815, filed on Nov. 19, 2018, the entire content of which is incorporated herein by reference.

TECHNICAL FIELD

This disclosure generally relates to a current sensor.

BACKGROUND DISCUSSION

A vehicle such as an electric vehicle is equipped with a rotating electric machine such as a three-phase alternating current (AC) motor (hereinafter, simply referred to as a motor in some cases) and an inverter. In such a vehicle, current flowing through the motor is measured, and rotation of the motor is appropriately controlled. In the case of a three-phase AC motor, U-phase, V-phase, and W-phase terminals are connected to an inverter via conductors called bus bars or the like, and magnitude of current flowing through each of the bus bars is measured by a current sensor.

A current sensor described in JP 2018-004269A (Reference 1) includes a core (one example of a magnetic core) being made of a magnetic material and having a small magnetic resistance, a bus bar, and a resin-made body (one example of a casing), with the core and bus bar being configured integrally with the body by insert molding. The bus bar is inserted into an inner space of the core. The magnetic core includes a pair of arm portions, and between a pair of the arm portions, a gap is formed. When current flows through the bus bar, a magnetic field is generated around the bus bar, depending on magnitude of the flowing current (hereinafter, simply referred to as current in some cases). A magnetic flux of this magnetic field is collected to the magnetic core having a small magnetic resistance, magnitude of the magnetic flux in the gap of the magnetic core is detected, and, based on the detected magnitude of the magnetic flux, the current flowing through the bus bar is acquired.

As described above, the current flowing through the bus bar is measured based on a magnetic flux of a magnetic field generated around the bus bar. At the time of this measurement, when an error occurs in a positional relation between the bus bar and the magnetic core, a detected magnetic flux changes, resulting in an error in a measured current value. However, in insert molding, it is difficult to ensure positional precision between the bus bar and the magnetic core.

A need thus exists for a current sensor which is not susceptible to the drawback mentioned above.

SUMMARY

A current sensor according to this disclosure includes a bus bar, a magnetic core, and a casing. Through the bus bar, measurement-target current flows, and the bus bar includes a plate-shaped portion. The magnetic core is arranged so as to be along a circumferential direction of the plate-shaped portion and surround the plate-shaped portion. The casing houses the bus bar and the magnetic core. The magnetic core is arranged in such a way that a thickness direction of the magnetic core is along a longitudinal direction of the plate-shaped portion. The casing includes a lower casing that covers the plate-shaped portion and the magnetic core from a lower side, and an upper casing that covers the plate-shaped portion and the magnetic core from an upper side and is fixed to the lower casing. The lower casing includes first and second press-fit portions. The first press-fit portion includes a groove portion into which the plate-shaped portion is press-fitted. In a state where the magnetic core is inserted downward into the second press-fit portion, both-side portions of the magnetic core in a width-direction are press-fitted into and held by the second press-fit portion. The upper casing includes a pressing portion that presses the bus bar and the magnetic core downward. The groove portion is a groove recessed downward, and is a groove along a thickness direction of the magnetic core.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

A current sensor according to an embodiment of this disclosure is described based on the drawings.

[Entire Configuration]

Figure 1:
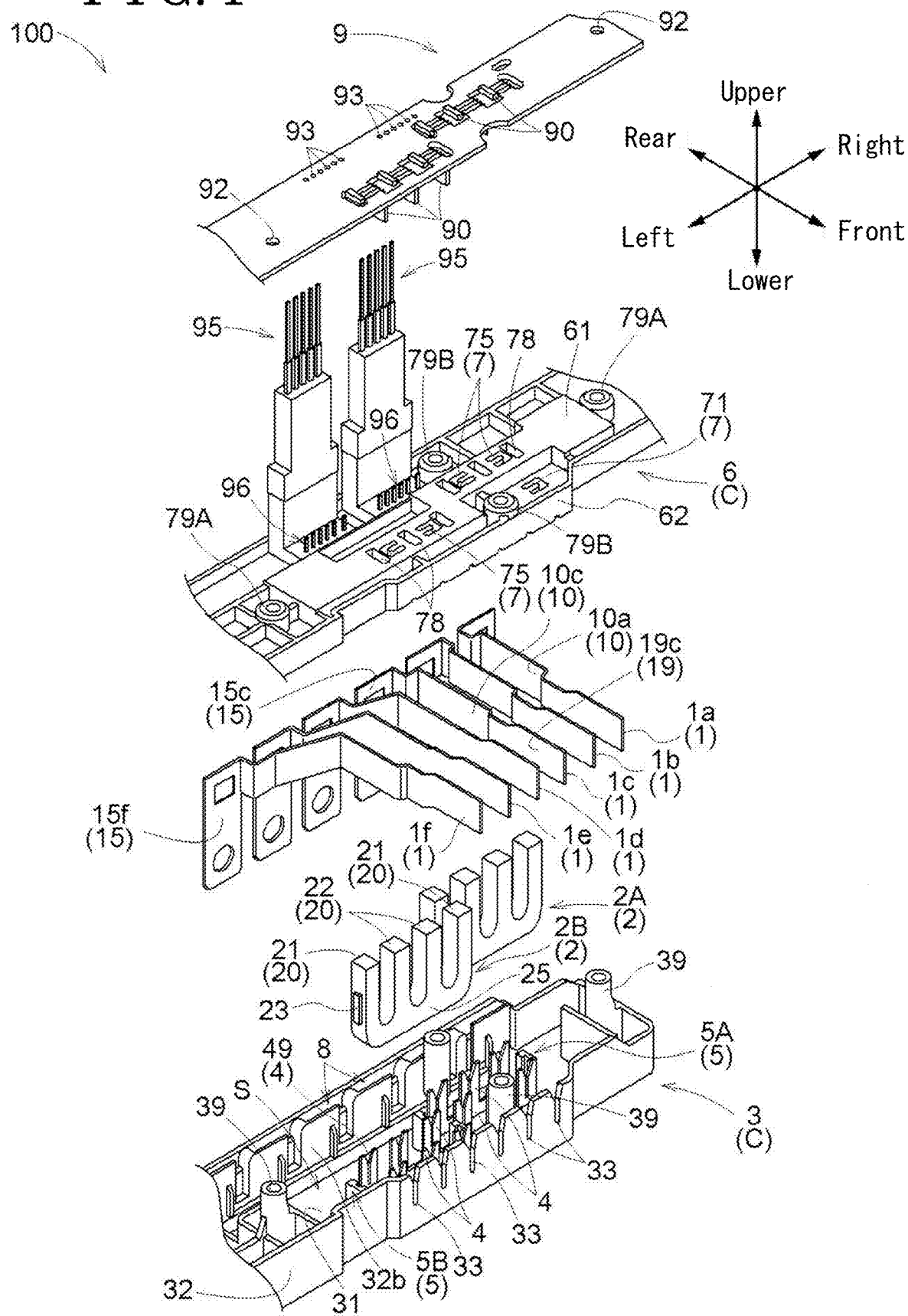
FIG. 1 is an exploded perspective view of a current sensor.

As illustrated in FIG. 1, a current sensor 100 includes six bus bars 1 through which current flows, a magnetic core 2 including a pair of arm portions 20, a circuit board 9 equipped with a detection element 90 that measures a magnetic flux flowing through the magnetic core 2, and a casing C that houses a part of the bus bars 1 and the magnetic core 2 and at which the circuit board 9 is installed. The casing C includes a lower casing 3 and an upper casing 6. The current sensor 100 includes two magnetic cores 2. The magnetic core 2 includes four arm portions 20, and between each pair of the adjacent arm portions 20, a space G is formed relatively. The magnetic core 2 is configured by stacking electromagnetic steel plates.

The current sensor 100 according to this embodiment includes two sets of bus bars 1, each set including three bus bars. In FIG. 1, bus bars 1a, 1b, and 1c form one set, and are arranged so as to be adjacent to each other. Bus bars 1d, 1e, and 1f form the other one set, and are arranged so as to be adjacent to each other. The bus bars 1a, 1b, and 1c are connected to a vehicle drive motor (one example of a rotating electric machine, not illustrated), for example. The bus bars 1d, 1e, and 1f are connected to, for example, a generator (one example of a rotating electric machine, not illustrated) that generates electric power to be consumed in the vehicle. End sides in the bus bars 1 and opposite to sides connected to the rotating electric machine are connected to an inverter or the like.

Figure 2:
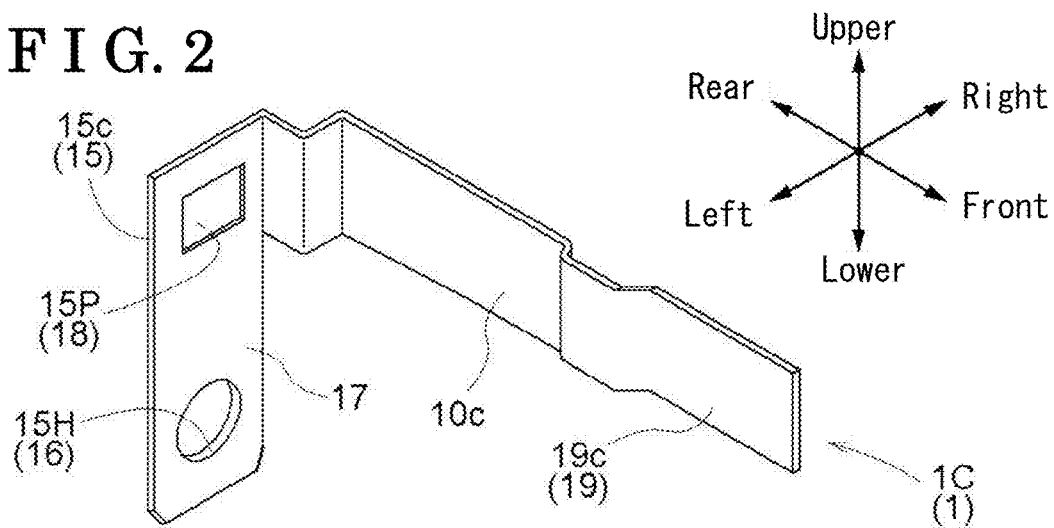
FIG. 2 is a perspective view of a bus bar.

As illustrated in FIGS. 1 and 2, the bus bar 1 includes at least a first plate portion 10 (one example of a plate-shaped portion) of a rectangular plate shape, a second plate portion 15 (one example of a second plate-shaped portion) of a rectangular plate shape, and a third plate portion 19 of a rectangular plate shape. In this embodiment, the second plate portion 15 is perpendicular to the first plate portion 10. The third plate portion 19 is parallel to the first plate portion 10.

In this embodiment, the bus bars 1*a*, 1*b*, 1*c*, 1*d*, 1*e*, and 1*f* illustrated in FIG. 1 are different in specific shapes, and are common in including at least the first plate portion 10 and the second plate portion 15, and other differences in shapes are due to differences in forms of appropriately modified attachment and layout. In this embodiment, the bus bars 1 are also common in including the third plate portion 19.

Hereinafter, the bus bar 1*c* illustrated in FIG. 2 is described as a representative of the bus bars 1, and individual descriptions of the common parts of the bus bars 1 other than the bus bar 1*c* are appropriately omitted. When it is necessary to individually describe or illustrate the common parts such as the first plate portion 10 and the second plate portion 15 of each bus bar 1, the first plate portion 10 of the bus bar 1*a* is represented as the first plate portion 10*a*, and the second plate portion 15 of the bus bar 1*f* is represented as the second plate portion 15*f*, for example, as illustrated in FIG. 1, and in such a manner, each of the common parts is represented or illustrated by adding the reference symbols a to f. Further, similarly, as to each part of the magnetic cores 2, the lower casing 3, and the upper casing 6 being associated with each of the bus bars 1, the common parts are described for parts associated with the bus bar 1*c*, and individual descriptions are appropriately omitted. In addition, when it is necessary to individually describe or illustrate each of the common parts, the common part is represented or illustrated by adding the reference symbols a to f, as necessary.

Hereinafter, as illustrated in FIG. 1 and the like, a longitudinal direction of the first plate portion 10 is written as a front-back direction, a side of the third plate portion 19 when viewed from the first plate portion 10 is written as a front side, and a side opposite thereto is written as a back side. A lateral direction of the first plate portion 10 is written as a vertical direction, and a side to which the second plate portion 15 extends out in a longitudinal direction thereof when viewed from the first plate portion 10 is written as a lower side, and a side opposite thereto is written as an upper side. Further, a side of the adjacent bus bar 1*b* when viewed from the bus bar 1*c* is written as a right side, and a side opposite thereto is written as a left side. The bus bars 1 are arranged in the order of the bus bars 1*a*, 1*b*, 1*c*, 1*d*, 1*e*, and 1*f* from the right side to the left side.

[Description of Each Part]

[Magnetic Core]

Figure 3:
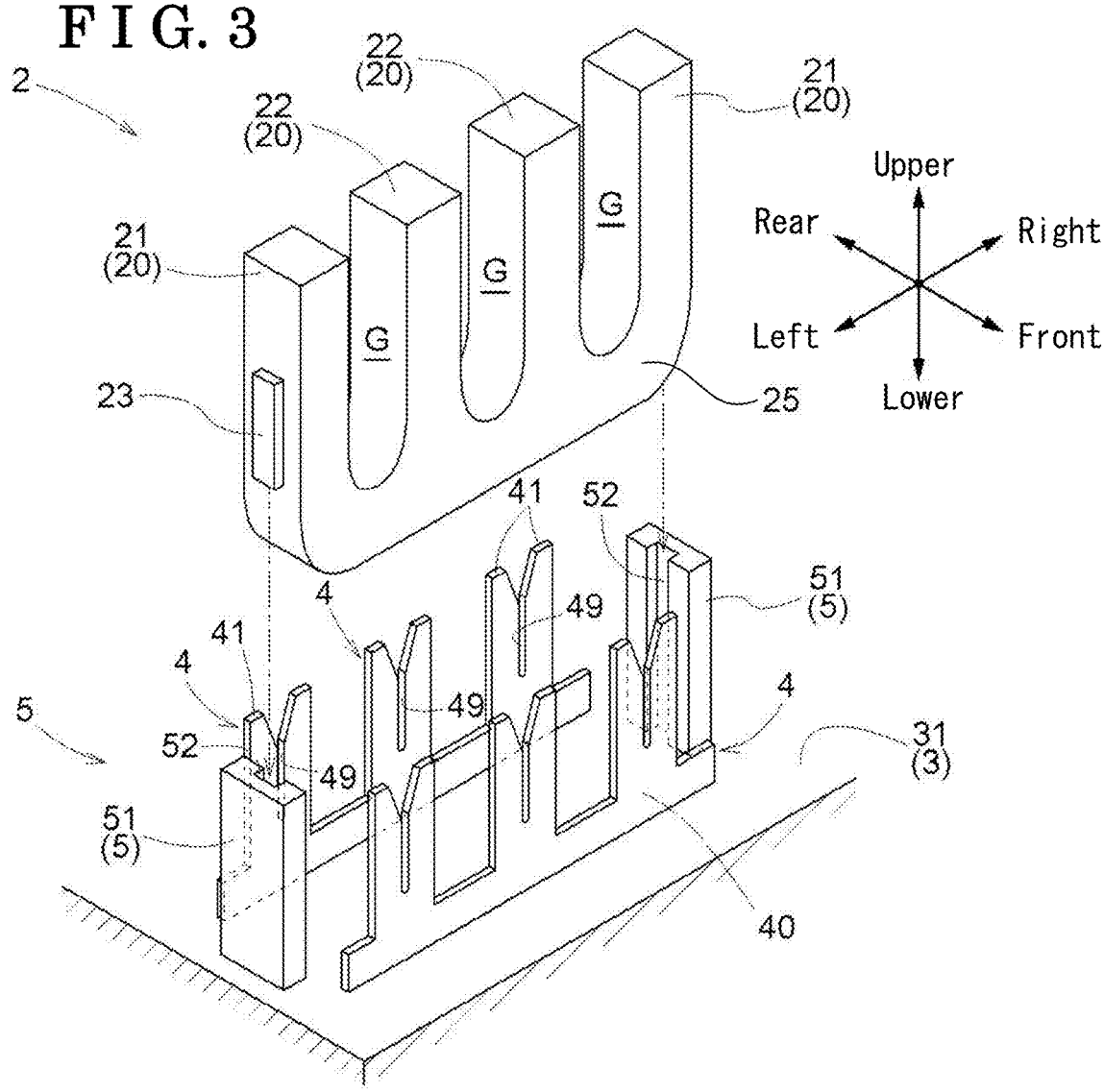
FIG. 3 is a perspective view of a magnetic core, first press-fit portions, and a second press-fit portion.

The magnetic core 2 is formed so as to include a magnetic material. As illustrated in FIGS. 1 and 3, the magnetic core 2 includes a plurality of (four in this embodiment) arm portions 20 and a yoke portion 25 that connects these arm portions 20. In this embodiment, the magnetic core 2 is symmetrical in terms of the left and right sides. Further, the magnetic core 2 is symmetrical in terms of the front and back sides. In this embodiment, a thickness direction of the magnetic core 2 corresponds to the front-back direction. A width direction of the magnetic core 2 corresponds to the left-right direction.

Each of the arm portions 20 extends out upward from the yoke portion 25. Each of the arm portions 20 that are among the four arm portions 20 and that are arranged on both sides of the magnetic core 2 is referred to as an outer arm portion 21 in some cases. The arm portions 20 arranged on left-right-direction inner sides of the left and right outer arm portions 21 are referred to as inner arm portions 22 in some cases.

The space G (refer to FIGS. 3, 8, and 9) is formed relatively between each one pair of the adjacent arm portions 20. The space G is an inner space of a U-shaped valley portion formed between a pair of the adjacent arm portions 20 and by the yoke portion 25, and is open on an upper side when viewed from the yoke portion 25. In other words, a vertical cross-section of the magnetic core 2 along the left-right direction has a U-shape that is open upward. One first plate portion 10 is inserted into each of the spaces G.

On left-right-direction outer side surfaces of a pair of the outer arm portions 21, linear protrusion portions 23 are formed so as to protrude from the side surfaces outward in the left-right direction. On the left-right-direction outer side surface of the outer arm portion 21, the linear protrusion portion 23 extends linearly along the extending direction of the arm portion 20.

In FIG. 1, the magnetic core 2 associated with the bus bars 1*a*, 1*b*, and 1*c* is illustrated as the magnetic core 2A, and the magnetic core 2 associated with the bus bars 1*d*, 1*e*, and 1*f* is illustrated as the magnetic core 2B.

[Casing]

[Lower Casing]

As illustrated in FIG. 1, the casing C is a body portion of the current sensor 100, and is a container that houses a part of the bus bars 1 and the magnetic cores 2. For example, the casing C is formed of PPS resin having heat resistance and wear resistance or the like. The casing C includes the lower casing 3 that covers the bus bars 1 and the magnetic cores 2 from a lower side, and the upper casing 6 that is placed on an upper side of the lower casing 3 and that covers the bus bars 1 and the magnetic cores 2 from an upper side.

Figure 4:
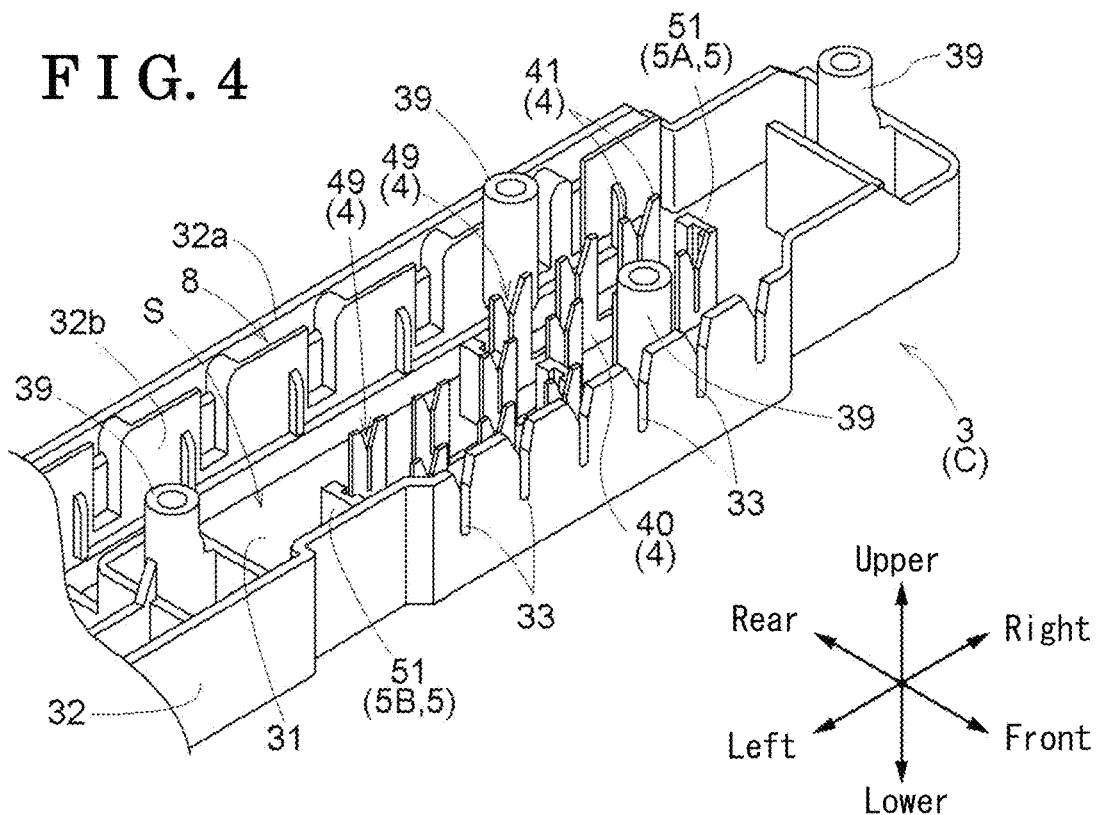
FIG. 4 is a perspective view of a lower casing.

As illustrated in FIG. 4, the lower casing 3 includes a bottom plate portion 31, and a wall 32 extending upward from an outer periphery of the bottom plate portion 31, and in an inner area S surrounded by the bottom plate portion 31 and the wall 32, includes a first press-fit portion 4 including a groove 49 into which the first plate portion 10 is press-fitted, a second press-fit portion 5 into which the magnetic core 2 is press-fitted, and a support portion 8 into which the second plate portion 15 is weakly inserted without a clearance or lightly press-fitted. On the front wall 32, a slit 33 as a cut-out from an upper end of the wall 32 toward a lower side is formed as an introduction hole for arranging the bus bar 1 so as to range from an inside to an outside of the lower casing 3.

As illustrated in FIG. 3, the second press-fit portion 5 is a fixing seat into which the magnetic core 2 is press-fitted to be fixed to the lower casing 3. The magnetic core 2 is press-fitted into the second press-fit portion 5 from the side of the yoke portion 25. The second press-fit portion 5 includes a pair of left and right frame bodies 51.

The frame body 51 is a columnar member extending out upward from the bottom plate portion 31. A thickness (width) of the frame body 51 along the front-back direction is the same as a thickness of the magnetic core 2. Each frame body 51 includes a rail portion 52 that is along the extending direction of the frame body 51 and that is a left-right inner side surface recessed outward. In other words, each frame body 51 has a U-shape that is a shape of a cross-section perpendicular to the vertical direction and that is open to the left-right inner side, and a valley portion of the U-shape is the rail portion 52. A width of the rail portion 52 in the front-back direction is equal to or slightly narrower than a width of the linear protrusion portion 23 in the front-back direction.

In the second press-fit portion 5, the magnetic core 2 is press-fitted between a pair of the left and right frame bodies 51 in a state where the left and right side surfaces of a pair of the outer arm portions 21 are along and in contact against the frame bodies 51. Thereby, a pair of the left and right frame bodies 51 restrain the magnetic core 2 in the left-right direction. In the second press-fit portion 5, the magnetic core 2 is press-fitted between a pair of the left and right frame bodies 51 in a state where at least parts of the linear protrusion portions 23 in both the left and right side portions of a pair of the outer arm portions 21 are fitted into the rail portions 52. Thereby, the rail portions 52 restrain the magnetic core 2 in the front-back direction. Note that the magnetic core 2 is press-fitted in a state where the yoke portion 25 is made to face the bottom plate portion 31. The magnetic core 2 is press-fitted while the linear protrusion portions 23 are made to bite into the left and right inner surfaces of the rail portions 52. Making the linear protrusion portions 23 bite into the left and right inner surfaces of the rail portions 52 causes the magnetic core 2 to be firmly fixed by press-fitting.

In this embodiment, two second press-fit portions 5 are provided in the lower casing 3. In FIG. 1, the second press-fit portion 5 associated with the magnetic core 2 associated with the bus bars 1a, 1b, and 1c is illustrated as a second press-fit portion 5A, and the second press-fit portion 5 associated with the magnetic core 2 associated with the bus bars 1d, 1e, and 1f is illustrated as a second press-fit portion 5B.

As illustrated in FIG. 1, the first press-fit portion 4 is a fixing seat into which the first plate portion 10 is press-fitted to be fixed to the lower casing 3. As illustrated in FIGS. 1 and 3, a pair of the first press-fit portions 4 are arranged on front and back sides of each of the second press-fit portions 5. Three pairs of the first press-fit portions 4 are arranged on front and back sides of each of the second press-fit portions 5A and 5B in association therewith. Three bus bars 1 associated with each of the second press-fit portions 5 are press-fitted in such a way that one bus bar 1 is press-fitted into each pair of the three pairs of the first press-fit portions 4.

As illustrated in FIG. 3, the first press-fit portion 4 includes a plate-shaped base portion 40 provided on the bottom plate portion 31, and a pair of left and right plate frames 41. The base portion 40 is a plate-shaped member that extends out upward from the bottom plate portion 31. The plate frame 41 is a plate-shaped member that extends out upward from the base portion 40. The plate frame 41 is a part of a plate integrally formed with the base portion 40. Plate surfaces of the plate frame 41 are arranged in parallel to the left-right direction. The plate surfaces of the plate frame 41 are parallel to both of thickness-direction surfaces of the magnetic core 2 press-fitted into the lower casing 3.

The base portion 40 and a pair of the left and right plate frames 41 relatively form, between a pair of left and right plate frames 41, a clearance-like groove portion 49 recessed downward in the vertical direction. A valley of the groove portion 49 is along the front-back direction. Into the groove portion 49, the first plate portion 10 is press-fitted. Note that a width of the groove portion 49 in the left-right direction is equal to or smaller than a thickness of the first plate portion 10.

The first plate portion 10 is fixed by being press-fitted into both of a pair of the front and back groove portions 49. The first plate portion 10 press-fitted into both of a pair of the front and back groove portions 49 is restrained in the left-right direction by a pair of the left and right plate frames 41.

Figure 5:
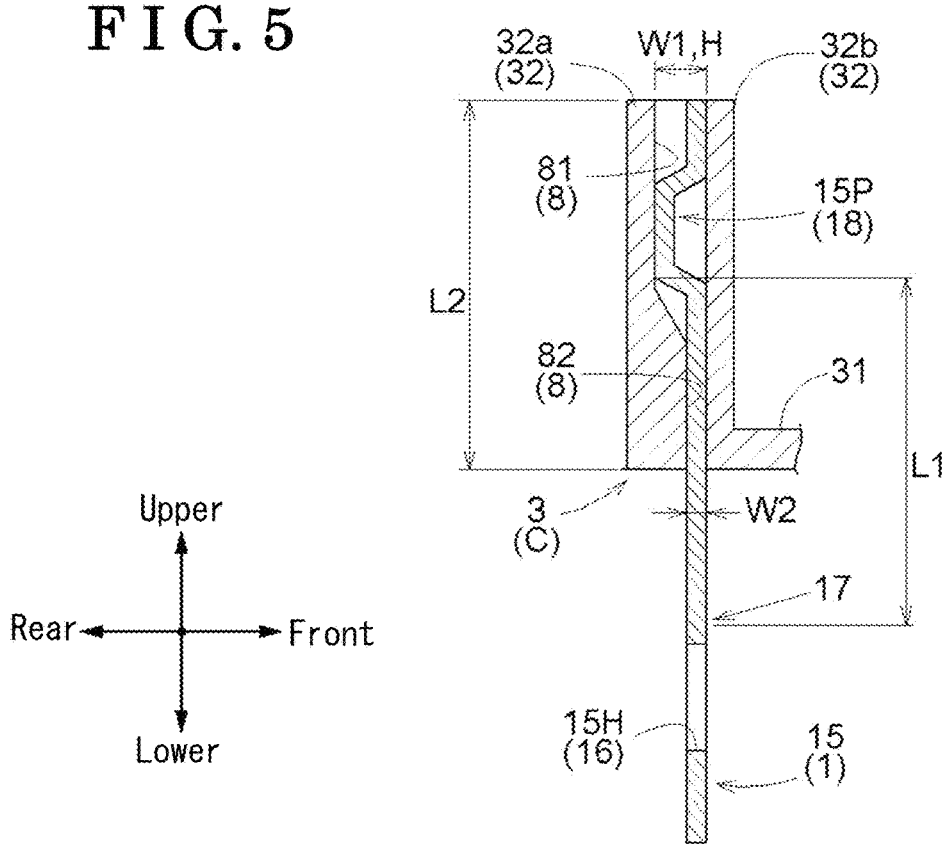
FIG. 5 is a partially enlarged view of a support portion.

As illustrated in FIG. 5, the second plate portion 15 is lightly pressed (lightly press-fitted) into and fixed to the support portion 8. As illustrated in FIG. 5, the support portion 8 includes at least a pair of front and back wall portions 32a and 32b, and includes, therebetween, a hole portion that vertically penetrates through the lower casing 3 (the bottom plate portion 31). The support portion 8 makes the inner area S of the lower casing 3 communicate with an outside of the lower casing 3. As illustrated in FIG. 4, the support portion 8 is formed on an inner-surface side of the back wall 32.

As illustrated in FIG. 5, the support portion 8 includes a clearance between a pair of the front and back wall portions 32a and 32b, into which both surfaces of the second plate portion 15 are fitted so as not to bite into the inner walls of the support portion 8. The support portion 8 fixes the second plate portion 15 in such a way that the bus bar 1 does not wobble. A horizontal cross-section of the support portion 8 includes a rectangular clearance whose longitudinal direction is along the left-right direction. The support portion 8 includes a first support portion 81 and a second support portion 82 on a lower side of the first support portion 81. A lateral-direction width W2 of a clearance of a horizontal cross-section of the second support portion 82 is narrower than a lateral-direction width W1 of a clearance of a horizontal cross-section of the first support portion 81. A specific form of fixing the second plate portion 15 by the support portion 8 is described below.

In addition, the lower casing 3 includes a plurality of bosses 39 including screw holes, as screw seats for fixing the upper casing 6 to the lower casing 3. The boss 39 extends out upward from the bottom plate portion 31.

[Upper Casing]

Figure 6:
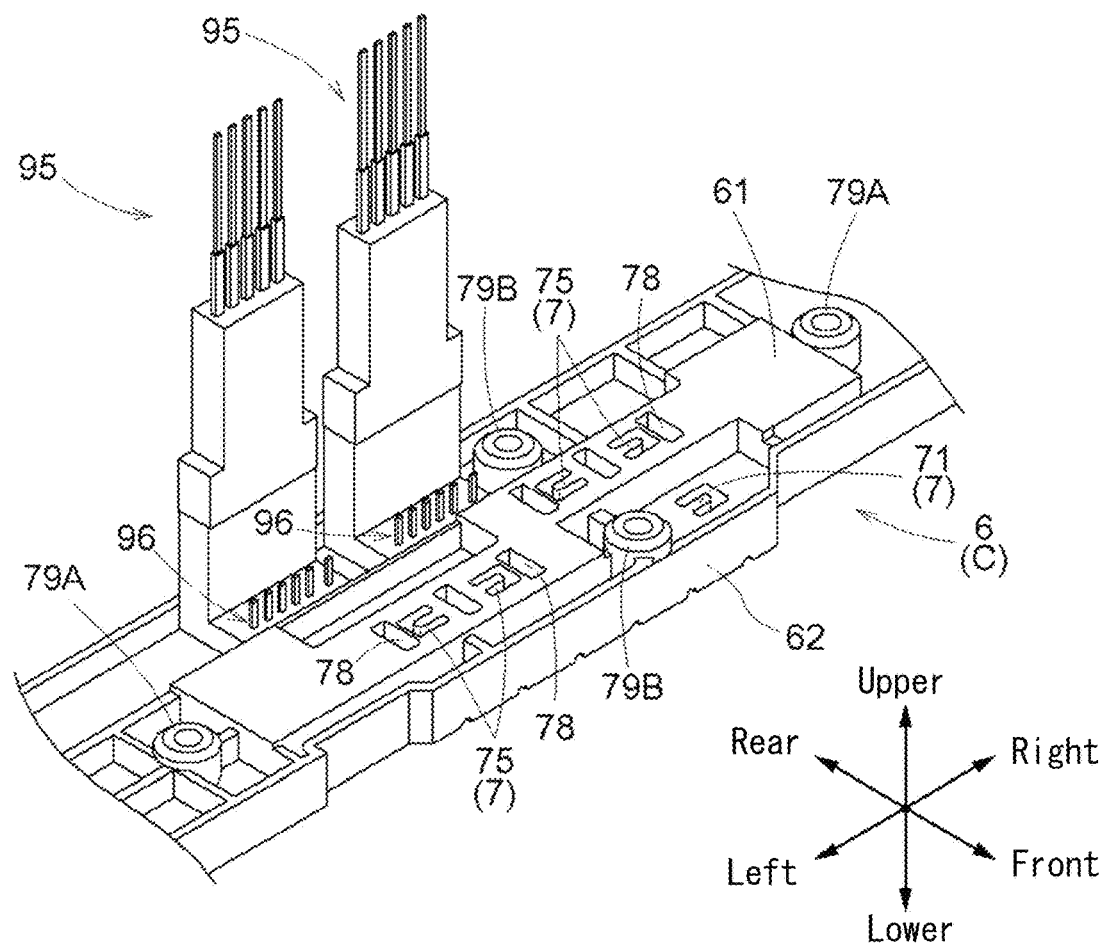
FIG. 6 is a perspective view of an upper casing.

As illustrated in FIG. 6, the upper casing 6 includes a top plate portion 61 and a wall 62 provided along an outer periphery of the top plate portion 61 and extending out vertically. The upper casing 6 covers the bus bars 1 and the magnetic cores 2 from an upper side in a state of being placed on the lower casing 3. On an upper surface of the upper casing 6, the circuit board 9 (refer to FIGS. 1 and 7) is placed.

The wall 62 is formed in a shape along a circumferential direction of the wall 32. A lower end of the wall 62 contacts against an upper end of the wall 32.

The top plate portion 61 includes a pressing portion 7 that presses the bus bar 1 and the magnetic core 2 downward, an element insertion hole 78 for inserting the detection element 90 into the space G, a boss 79A including a screw hole for fixing the circuit board 9, and a screw attachment hole 79B for fixing the upper casing 6 to the lower casing 3. Further, at the top plate portion 61, there is mounted a connector 95 for electrically connecting the circuit board 9 to an external electric circuit or the like, and a connection terminal 96 such as a press-fit terminal for electrically connecting the connector 95 to the circuit board 9. An upper end surface of the boss 79A is positioned on an upper side of upper surfaces of the remaining parts of the top plate portion 61.

The element insertion hole 78 is a penetration hole that penetrates through the top plate portion 61 in the vertical direction. Into the element insertion hole 78, the detection element 90 mounted on the circuit board 9 is inserted from an upper side toward a lower side. The element insertion hole 78 is arranged at a position that is in the top plate portion 61 and that overlaps with the space G of the magnetic core 2 in the vertical direction. In this embodiment, the element insertion hole 78 is a penetration hole including a rectangular opening whose longitudinal direction is along the front-back direction.

The pressing portion 7 includes a first pressing portion 71 that presses the bus bar 1 downward and a second pressing portion 75 that presses the magnetic core 2 downward.

Figure 8:
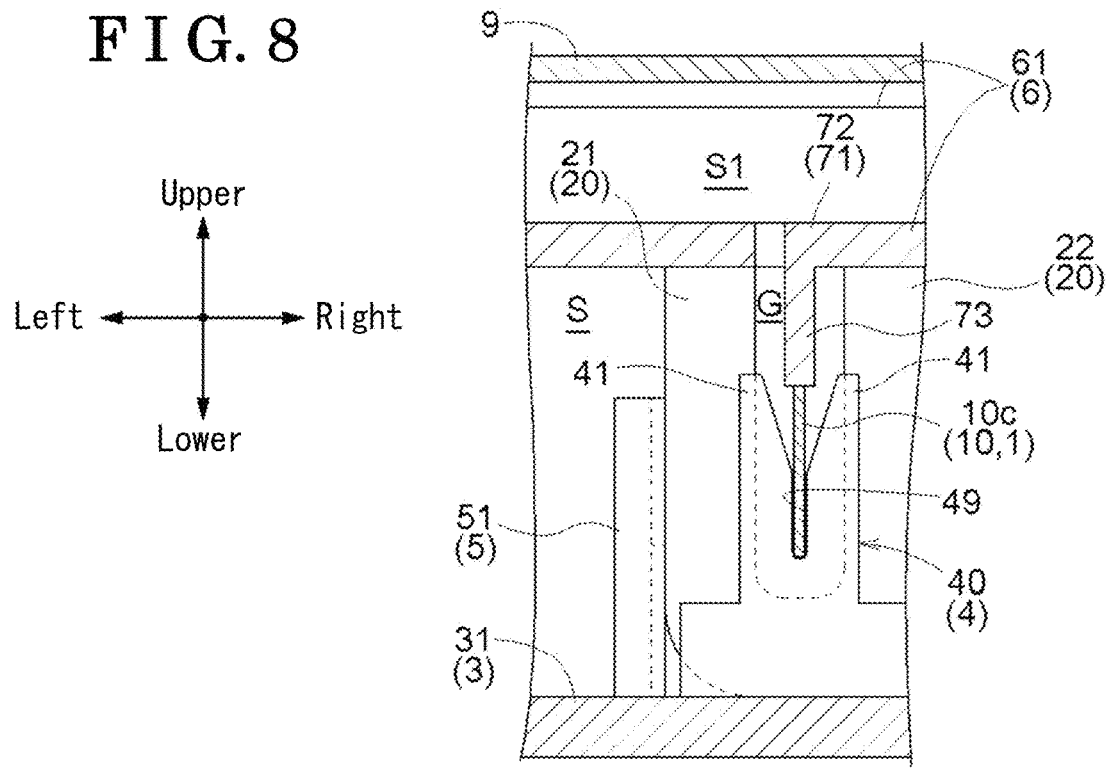
FIG. 8 is a partially enlarged sectional view of a first pressing portion.

FIG. 8 illustrates a cross-sectional view perpendicular to the front-back direction of the first pressing portion 71. The first pressing portion 71 is a fixture that holds the bus bar 1 between the lower casing 3 and the fixture and thereby fixes the bus bar 1 while pressing the bus bar 1 toward the lower casing 3. The first pressing portion 71 includes a first beam portion 72 (one example of a beam portion) whose one end is fixed to the top plate portion 61 and whose opposite end is separated from the top plate portion 61, and a first projection portion 73 (one example of a convex portion) that projects downward from a distal end portion on the opposite end side of the first beam portion 72.

In this embodiment, the first beam portion 72 extends out in the horizontal direction toward the opposite end side from the one end side that is fixed to the top plate portion 61. An upper surface of the first beam portion 72 is arranged so as to be positioned on a lower side recessed relative to the upper surface of the top plate portion 61 around the first beam portion 72, and a space S1 exists on an upper side of the first beam portion 72. The first beam portion 72 has elasticity that allows the opposite end side to bend and deform upward.

The first projection portion 73 contacts against an upper end of the first plate portion 10, and presses the first plate portion 10 downward. The first projection portion 73 is arranged at a position that overlaps with the first plate portion 10 in the vertical direction and that does not overlap with the element insertion hole 78 (refer to FIG. 6) in the vertical direction.

The first beam portion 72 bends upward by reaction force when the first projection portion 73 presses the bus bar 1. This bending occurs in the space S1 on the upper side of the first beam portion 72. In other words, even when the first beam portion 72 bends upward, the first beam portion 72 remains positioned on the lower side of the upper surface of the top plate portion 61, and does not protrude upward from the upper surface of the top plate portion 61.

Figure 9:
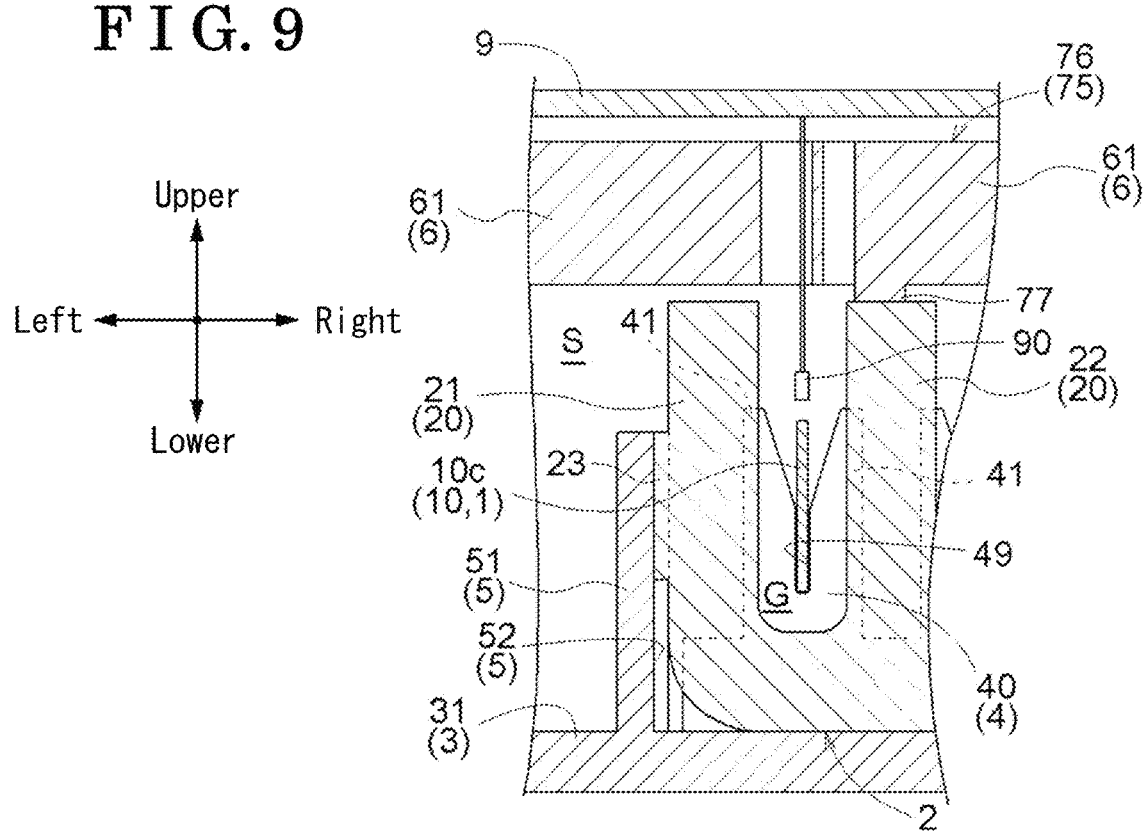
FIG. 9 is a partially enlarged sectional view of a second pressing portion.

FIG. 9 illustrates a cross-sectional view perpendicular to the front-back direction of the second pressing portion 75. The second pressing portion 75 is a fixture that holds the magnetic core 2 between the lower casing 3 and the fixture and thereby fixes the magnetic core 2 while pressing the magnetic core 2 toward the lower casing 3. The second pressing portion 75 includes a second beam portion 76 (one example of a beam portion) whose one end is fixed to the top plate portion 61 and whose opposite end is separated from the top plate portion 61, and a second projection portion 77 (one example of a convex portion) that projects downward from a distal end portion on the opposite end side of the second beam portion 76.

In this embodiment, the second beam portion 76 extends out in the horizontal direction (perpendicular to the vertical direction) toward the opposite end side from the one end side fixed to the top plate portion 61.

The second projection portion 77 contacts against an upper end of the arm portion 20 of the magnetic core 2, and presses the magnetic core 2 downward. The second projection portion 77 is arranged at a position that overlaps with the arm portion 20 when viewed in the vertical direction. FIG. 9 illustrates the case where the second projection portion 77 (the second pressing portion 75) is arranged only at the position that overlaps with the inner arm portion 22 when viewed in the vertical direction, and two of the second pressing portions 75 are arranged for each of the two magnetic cores 2.

The second beam portion 76 bends upward by reaction force when the second projection portion 77 presses the upper end of the arm portion 20.

[Bus Bar]

As illustrated in FIGS. 1 and 2, the bus bar 1 is a conductor through which measurement-target current flows, with the measurement-target current flowing through the rotating electric machine. For example, copper or copper alloy having excellent conductivity is cut out by blanking, and is further bent into a desired shape by press forming or the like, and thereby, the bus bar 1 is formed. As described above, the bus bar 1 includes at least the first plate portion 10, the second plate portion 15, and the third plate portion 19, and in the illustration of FIGS. 1 and 2, the third plate portion 19, the first plate part 10, and the second plate part 15 are arranged in this order from a front side toward a back side. In this embodiment, the second plate portion 15 is arranged at one end portion (one example of the one end) of the bus bar 1, and the third plate portion 19 is arranged at the opposite end portion. The connection portions between the third plate portion 19 and the first plate portion 10 and between the first plate portion 10 and the second plate portion 15 are each integrally made via a bent plate portion. In the bus bar 1, the first plate portion 10 and the second plate portion 15 are fixed to the casing C.

As illustrated in FIGS. 8 and 9, the first plate portion 10 is housed in the inner area S of the lower casing 3. In the bus bar 1, the first plate portion 10 is held by the lower casing 3 and the upper casing 6. The first plate portion 10 is press-fitted into depths of the groove portions 49, and the lower end thereof contacts against the base portions 40. In this state, the first plate portion 10 is inserted into the space G of the magnetic core 2 as described above. The first plate portion 10 is inserted into the space G in such a way that the plate surface thereof is parallel to the extending direction (the vertical direction) of the arm portion 20. The upper end of the first plate portion 10 is arranged on a lower side of the upper end of the arm portion 20. Note that the magnetic core 2 and the bus bar 1 (the first plate portion 10) do not contact with each other. Distances on left and right sides between the both surfaces of the first plate portion 10 and a pair of the adjacent arm portions 20 may be equal to each other.

As illustrated in FIG. 1, the third plate portion 19 is used as a terminal electrically connected to an external device. In this embodiment, the third plate portion 19 is formed in a plate shape as an example. At least a distal end of the third plate portion 19 is arranged outside the casing C. The third plate portion 19 is inserted into the slit 33, and is held by the lower casing 3. For example, in the bus bar 1, a side of the third plate portion 19 is connected to the inverter.

The second plate portion 15 is used as a terminal electrically connected to an external device. The second plate portion 15 is connected to the rotating electric machine, for example. As illustrated in FIGS. 2 and 5, the second plate portion 15 includes, at an end portion thereof, a terminal portion 16 including a penetration hole 15H for connection to an external electric wire or the like, and further includes a supported portion 18 including a projection portion 15P protruding in a thickness direction of the second plate portion 15, and an intermediate plate portion 17 between the terminal portion 16 and the supported portion 18. As illustrated in FIG. 5, the second plate portion 15 is inserted into the support portion 8.

As illustrated in FIGS. 2 and 5, the terminal portion 16 is arranged at the lower end of the second plate portion 15. The penetration hole 15H penetrates through the terminal portion 16 in the thickness direction (the front-back direction).

One surface of the second plate portion 15 is pressed by press forming or the like for example in such a way that the other surface projects, and thereby, the projection portion 15P of the supported portion 18 is formed. The projection portion 15P projects from one surface of the supported portion 18. The maximum thickness H of the supported portion 18 is equal to or larger than the width W1 of the first support portion 81. Note that the maximum thickness H of the supported portion 18 in this embodiment is a thickness of the second plate portion 15 that includes a projection height of the projection portion 15P, at a location where the projection portion 15P is formed.

A length L1 of the intermediate plate portion 17 in the extending direction (the vertical direction: a direction of insertion into the support portion 8) of the second plate portion 15 is larger than a hole length L2 of the support portion 8 on a side that the projection portion 15P of the second plate portion 15 faces. Accordingly, when the second plate portion 15 is inserted into the support portion 8, the penetration hole 15H of the terminal portion 16 completely passes through the support portion 8 and is exposed to an outside before the projection portion 15P contacts against the inner wall of the support portion 8. Thereby, at a stage where the projection portion 15P contacts against the inner wall of the support portion 8, a state where the terminal portion 16 does not contacts with the inner wall of the support portion 8 can be ensured, and a periphery of the penetration hole 15H is not scratched.

As illustrated in FIG. 5, the second plate portion 15 is inserted into the support portion 8 in a state where at least the projection portion 15P in the supported portion 18 is arranged in the first support portion 81, and at least a part of the intermediate plate portion 17 is arranged in the second support portion 82. The second plate portion 15 is arranged in such a way that at least the penetration hole 15H in the terminal portion 16 is positioned outside the support portion 8 (the casing C). Since the maximum thickness H of the supported portion 18 is equal to or larger than the width W1 of the first support portion 81, the supported portion 18 that is a part of the second plate portion 15 is restrained by the first support portion 81. Thereby, one end side (the second plate portion 15) of the bus bar 1 is supported by the support portion 8.

[Circuit Board]

Figure 7:
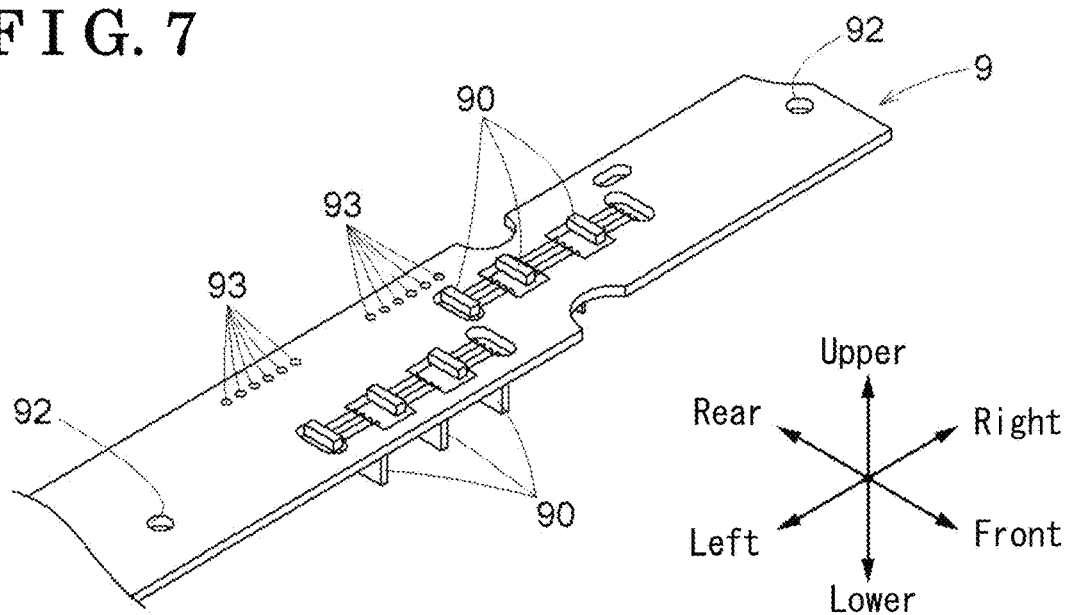
FIG. 7 is a perspective view of a circuit board.

As illustrated in FIG. 7, the circuit board 9 includes a plurality of (six in this embodiment) detection elements 90 mounted on a lower surface thereof in a form of extending out downward, screw attachment holes 92 for fixing the circuit board 9 to the upper casing 6, and through holes 93 electrically connected to the detection elements 90 or the like via a wiring pattern or the like on the circuit board 9. Electrical connection is made by inserting the connection terminals 96 into the through holes 93, thereby the circuit board 9 is electrically connected to external devices via the connectors 95 (refer to FIGS. 1 and 6).

The detection element 90 is an element capable of detecting at least magnitude of a magnetic flux. For example, a tunnel magnetoresistive element (what is called a TMR element), a magnetoresistive effect element (what is called an AMR element), a giant magnetoresistance (what is called a GMR element), or the like can be used as the detection element 90. The detection element 90 outputs information (hereinafter, written as magnetic flux information) including at least magnitude of a magnetic flux, to an external device (e.g., an ECU of the vehicle, not illustrated) via the connector 95. Based on this magnetic flux information, the ECU or the like calculates a value of current flowing through the bus bar 1 (refer to FIG. 1 and the like).

[Regarding Assembling]

The following describes assembling of the current sensor 100. First, the magnetic core 2 is press-fitted into the second press-fit portion 5 of the lower casing 3 (refer to FIG. 3). Thereby, the magnetic core 2 is restrained in the left-right direction and the front-back direction. Next, the first plate portion 10 of the bus bar 1 is press-fitted into the first press-fit portion 4 of the lower casing 3 (refer to FIGS. 8 and 9). Thereby, the bus bar 1 is restrained in the left-right direction. In this state, the bus bar 1 and the magnetic core 2 are restrained relative to each other in the left-right direction via the lower casing 3 (refer to FIG. 10 and the like).

When the first plate portion 10 is press-fitted into the first press-fit portion 4, the third plate portion 19 is inserted into the slit 33, and the second plate portion 15 is inserted into the support portion 8. Inserting the second plate portion 15 into the support portion 8 restrains the bus bar 1 in the front-back direction (refer to FIG. 1 and the like).

Note that, when the second plate portion 15 is inserted into the support portion 8, as illustrated in FIG. 5, first, the terminal portion 16 is inserted into the support portion 8, and next, the intermediate plate portion 17 and the supported portion 18 are inserted into the support portion 8 in this order. Since the length L1 of the intermediate plate portion 17 is longer than the hole length L2 of the support portion 8 on the side that the projection portion 15P faces, the projection portion 15P of the supported portion 18 is inserted into the first support portion 81 after a part including the penetration hole 15H in the terminal portion 16 passes through the second support portion 82 and is exposed to (protrudes out to) an outside. Accordingly, the terminal portion 16 is not affected by reaction force when the projection portion 15P contacts with the inner surface of the first support portion 81. Thereby, at the time of passing through the second support portion 82, the terminal portion 16 is prevented from unevenly contacting with, e.g., strongly rubbing against a part of an inner wall surface of the second support portion 82. For this reason, on the terminal portion 16 (around the penetration hole 15H), a scratch due to rubbing or the like does not occur.

Figure 10:
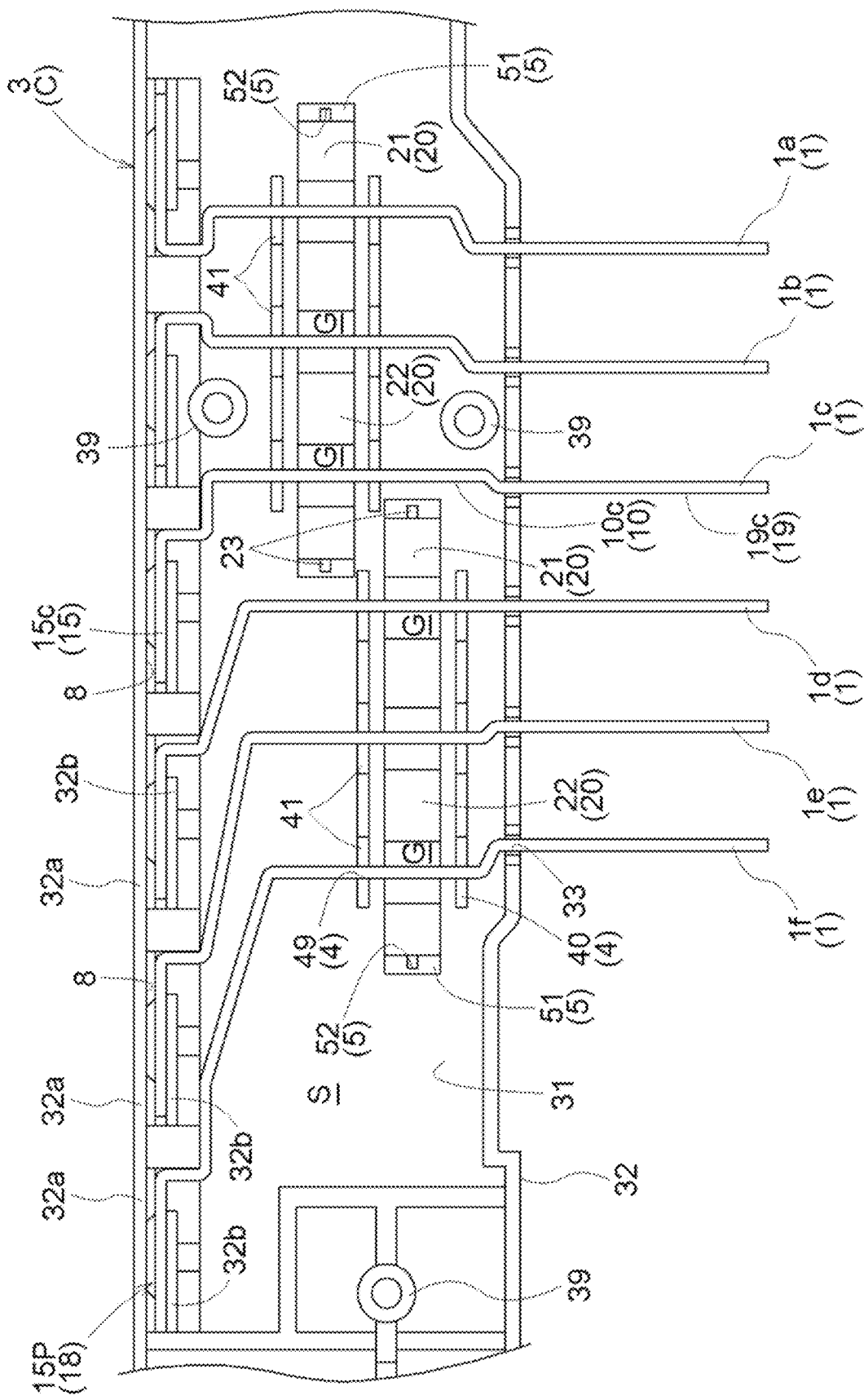
FIG. 10 is a top view of the lower casing in which the magnetic cores and the bus bars are attached.

As described above, the magnetic cores 2 and the bus bars 1 are attached to the lower casing 3. FIG. 10 is a top view when the magnetic cores 2 and the bus bars 1 are attached to the lower casing 3.

After that, the lower casing 3 is covered with the upper casing 6 from an upper side (refer to FIG. 1). At this time, the first pressing portion 71 contacts against the bus bar 1 and presses the bus bar 1. Thereby, the bus bar 1 is restrained in the vertical direction by the casing C (refer to FIG. 8). The second pressing portion 75 contacts against the magnetic core 2, and presses the magnetic core 2 (refer to FIG. 9).

Thereby, the magnetic core 2 is restrained in the vertical direction by the casing C. Accordingly, the bus bar 1 and the magnetic core 2 are restrained relative to each other via the casing C in the vertical direction. The lower casing 3 and the upper casing 6 are fixed to each other by fixing screw holes of the bosses 39 and the screw attachment holes 79B to each other with screws or the like (refer to FIG. 1).

As described above, according to the current sensor 100, only placing the magnetic core 2, the bus bar 1, and the upper casing 6 in order on the lower casing 3 so as to overlap with each other in the vertical direction restrains the magnetic core 2 and the bus bar 1 in the vertical direction and in the left-right direction, and thus, a state of a magnetic flux generated in the magnetic core 2 due to current flowing through the bus bar 1 is made stable in relation to an amount of current flowing through the bus bar 1, and an error is reduced. Thereby, accuracy of measuring a value of current in the bus bar 1 by the current sensor 100 is improved.

The circuit board 9 is placed on the upper surface of the upper casing 6 (refer to FIG. 1). At this time, the detection element 90 is inserted from an upper side of the element insertion hole 78, and is inserted down to the space G through the element insertion hole 78 (refer to FIG. 9). Thereby, the detection element 90 is installed at a position that is on an upper side of the bus bar 1 and that overlaps with the bus bar 1 and the yoke portion 25 in the vertical direction. Distances between the detection element 90 and the adjacent left and right arm portions 20 may be equal to each other. The detection element 90 is installed at a position overlapping with upper end sides of a pair of the adjacent arm portions 20 in the left-right direction. Since the detection element 90 is installed at the position overlapping with a pair of the adjacent arm portions 20 in the left-right direction, the detection element 90 can detect magnitude of the magnetic flux between a pair of the adjacent arm portions 20.

In this embodiment, when the circuit board 9 is placed on the upper surface of the upper casing 6, the connection terminals 96 are inserted into the through holes 93 to establish electrical connections. In a state of being placed on the upper casing 6, the circuit board 9 is fixed, for example, by connecting the screw attachment holes 92 and the screw holes of the bosses 79A with screws (refer to FIG. 11). In this embodiment, by being placed on the bosses 79A, the circuit board 9 is mounted on the upper casing 6 in a state of floating from the upper surfaces of the remaining parts of the top plate portion 61. For this reason, even when the second beam portion 76 bends upward, the upper surface of the second beam portion 76 does not contact with the circuit board 9. Note that the timing for placing and fixing the circuit board 9 on the upper casing 6 may be before, after, or simultaneously with fixing between the lower casing 3 and the upper casing 6.

Figure 11:
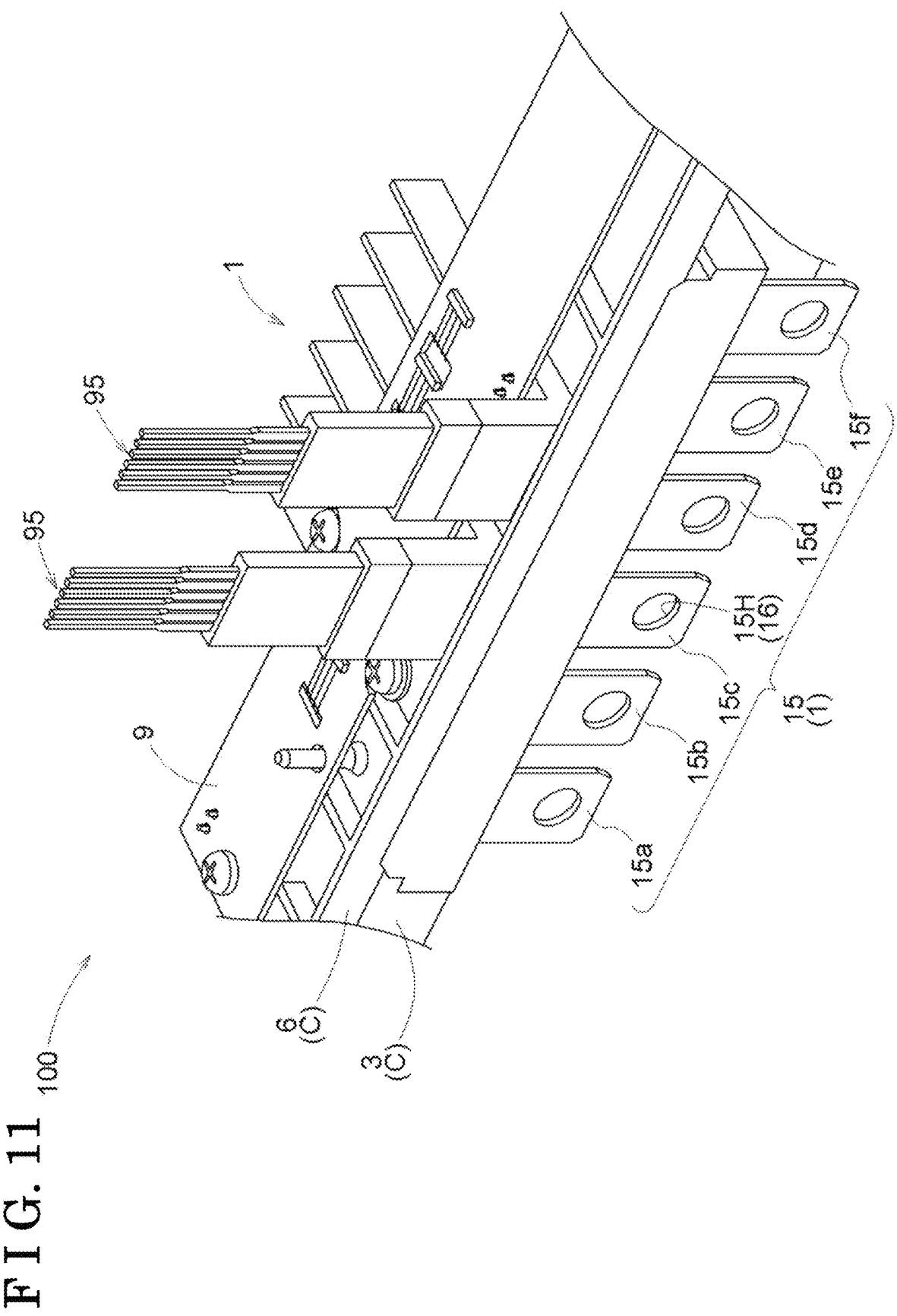
FIG. 11 is a perspective view of the current sensor.

The current sensor 100 can be assembled by easy work of superposing each of the portions in order so as to overlap with each other in the vertical direction in the manner as described above. For this reason, the assembling workability is outstandingly high. FIG. 11 is a perspective view of an entire configuration of the current sensor 100 that has been assembled.

As described above, it is possible to provide the current sensor that can ensure positional accuracy between the bus bar and the magnetic core.

[Different Embodiments]

(1) In the above-described embodiment, description is made above on the case where the second projection portion 77 (the second pressing portion 75) is arranged only at the position overlapping with the inner arm portion 22 in the vertical direction, and presses the upper end of the inner arm portion 22. However, the second projection portion 77 may press the upper end of any of the arm portions 20. For example, the second projection portions 77 may be provided at positions overlapping with all of the arm portions 20 in the vertical direction, and may press the upper ends of all of the arm portions 20. Alternatively, the second projection portions 77 may be provided at positions overlapping with a pair of the outer arm portions 21 in the vertical direction, and may press the upper ends of the outer arm portions 21.

(2) In the above-described embodiment, it is described above that the upper surface of the first beam portion 72 is arranged so as to be positioned on a lower side of the upper surface of the top plate portion 61 around the first beam portion 72, the space S1 exists on an upper side of the first beam portion 72, the first beam portion 72 has elasticity that allows the opposite end side thereof to bend and deform upward, and bending when the first beam portion 72 bends upward by reaction force at the time of pressing the bus bar 1 by the first projection portion 73 occurs in the space S1 on the upper side of the first beam portion 72, however, the similar configuration may be adopted for the second beam portion 76. In other words, the second beam portion 76 may be arranged in such a way that the upper surface thereof is positioned on a lower side of the upper surface of the top plate portion 61 around the second beam portion 76, a space may be formed on an upper side of the second beam portion 76, the second beam portion 76 may have elasticity that allows the opposite end side thereof to bend and deform upward, and bending when the second beam portion 76 bends upward by reaction force at the time of pressing the magnetic core 2 by the second projection portion 77 may occur in the space formed on the upper side of the second beam portion 76.

(3) Although, in the above-described embodiment, description is made above on the case where the number of the bus bars 1 is six, the number of the bus bars 1 may be at least one.

(4) In the above-described embodiment, description is made above on the case where the magnetic core 2 includes four arm portions 20, but according to an aspect, the magnetic core 2 may include a pair of the arm portions 20 for one bus bar 1.

(5) In the above-described embodiment, description is made above on the case where the second plate portion 15 includes the terminal portion 16 including, at the end portion thereof, the penetration hole 15H for making connection to an external electric wire or the like. However, according to a connection method of making connection to an external electric wire or the like, there is a case where the terminal portion 16 does not include the penetration hole 15H. For example, the plate-shaped terminal portion 16 that does not include a penetration hole or the like may be used, as it is, as a terminal for making connection to an external electric wire or the like.

(6) In the above-described embodiment, description is made above on the case where, in association with each of the bus bars 1, three pairs of the first press-fit portions 4 are arranged on the front and back sides of each of the second press-fit portions 5A and 5B, and the first plate portion 10 is press-fitted into both of a pair of the front and back groove portions 49. However, at least one first press-fit portion 4 may be provided for one bus bar 1.

Note that, as long as contradiction does not arise, the configurations disclosed in the above-described embodiments (including the different embodiments, the same applies to the following) can be applied in combination with the configurations disclosed in the other embodiments. The embodiments disclosed in this specification are exemplifications, and the embodiments of this disclosure are not limited thereto, and can be appropriately modified without departing from the object of this disclosure.

This disclosure can be applied to a current sensor including a bus bar and a magnetic core.

A current sensor according to this disclosure includes a bus bar, a magnetic core, and a casing. Through the bus bar, measurement-target current flows, and the bus bar includes a plate-shaped portion. The magnetic core is arranged so as to be along a circumferential direction of the plate-shaped portion and surround the plate-shaped portion. The casing houses the bus bar and the magnetic core. The magnetic core is arranged in such a way that a thickness direction of the magnetic core is along a longitudinal direction of the plate-shaped portion. The casing includes a lower casing that covers the plate-shaped portion and the magnetic core from a lower side, and an upper casing that covers the plate-shaped portion and the magnetic core from an upper side and is fixed to the lower casing. The lower casing includes first and second press-fit portions. The first press-fit portion includes a groove portion into which the plate-shaped portion is press-fitted. In a state where the magnetic core is inserted downward into the second press-fit portion, both-side portions of the magnetic core in a width-direction are press-fitted into and held by the second press-fit portion. The upper casing includes a pressing portion that presses the bus bar and the magnetic core downward. The groove portion is a groove recessed downward, and is a groove along a thickness direction of the magnetic core.

According to the above-described configuration, the lower casing supports the magnetic core by the second press-fit portion. At this time, both-side portions of the magnetic core in the width-direction is held in a state where the magnetic core is pressed into the second press-fit portion from an upper side toward a lower side. Thereby, the magnetic core is restrained so as not to move in the width direction.

According to the above-described configuration, the lower casing supports the plate-shaped portion of the bus bar by the groove portion of the first press-fit portion. This groove is a groove recessed downward, and is a groove along the thickness direction of the magnetic core, i.e., a groove extending in a direction perpendicular to the width direction of the magnetic core. Accordingly, the plate-shaped portion of the bus bar is press-fitted into the groove portion from an upper side toward a lower side, and thereby, is supported by the first press-fit portion in a state of being along the thickness direction of the magnetic core, and is restrained so as not to move in the width direction of the magnetic core.

According to the above-described configuration, the upper casing presses the bus bar and the magnetic core downward in a state of covering the plate-shaped portion and the magnetic core from an upper side and being fixed to the lower casing. Accordingly, the bus bar and the magnetic core are restrained by the upper casing, and the first press-fit portion and the second press-fit portion of the lower casing so as not to move in the vertical direction.

With the above-described configuration, the bus bar and the magnetic core are fixed so as not to move (relatively) relative to each other in the width direction of the magnetic core. Further, the bus bar and the magnetic core are fixed so as not to move (relatively) relative to each other in the vertical direction. Accordingly, it is possible to provide the current sensor that can ensure positional precision between the bus bar and the magnetic core.

In addition, with the above-described configuration, the current sensor can be assembled by a simple assembling method of stacking the lower casing, the magnetic core and bus bar, and the upper casing in order from a lower side. In other words, both a simple assembling method and ensuring of positional precision between the bus bar and the magnetic core can be compatibly achieved.

In the current sensor according to this disclosure, the first press-fit portion may include a pair of the grooves, and a pair of the grooves may be arranged on thickness-direction front and back sides of the magnetic core press-fitted into the second press-fit portion.

According to the above-described configuration, a pair of the grooves arranged on thickness-direction front and back sides of the magnetic core can restrain the bus bar so as not to move in the width direction of the magnetic core. Thereby, the bus bar and the magnetic core are securely fixed so as not to move (relatively) relative to each other.

In the current sensor according to this disclosure, the pressing portion may include a beam portion including one end fixed to the upper casing, and a convex portion being provided on an opposite end side of the beam portion and protruding downward from a lower surface of the beam portion, and the convex portion may press the bus bar and the magnetic core downward.

According to the above-described configuration, the upper casing can press the bus bar and the magnetic core downward by the convex portion provided on the opposite end side of the beam portion. At this time, with the beam portion being made to bend, the convex portion can press the bus bar and the magnetic core downward while one end side that is in the beam portion and that is fixed to the casing (e.g., formed integrally with the casing) functions as a supporting point. Thereby, even when forming precision of the upper casing is not raised unnecessarily (e.g., even when the upper casing is manufactured with insecure precision), a precision error can be absorbed by the bending (warping) of the beam portion. Thereby, cost reduction can be achieved.

In the current sensor according to this disclosure, an upper surface of the opposite end side of the beam portion that presses the bus bar may be arranged at a position recessed so as to be on a lower side of an upper surface of the upper casing.

According to the above-described configuration, the upper surface of the opposite end side of the beam portion is arranged at the position recessed so as to be on a lower side of the upper surface of the upper casing, and thereby, a space to which the beam portion bends (warps) can be ensured on an upper side of the opposite end side of the beam portion. Accordingly, it is ensured that the upper casing presses the bus bar downward.

In the current sensor according to this disclosure, the bus bar may include a second plate-shaped portion at one end. The casing may include a support portion including a clearance that penetrates in a vertical direction and into which the second plate-shaped portion is inserted. The support portion may include a first support portion, and a second support portion where the clearance is narrower than in the first support portion. The second plate-shaped portion may include a terminal portion that is arranged on an end side of the bus bar and that includes a penetration hole penetrating in a thickness direction of the second plate-shaped portion, and a supported portion that includes a projection portion protruding in a thickness direction of the second plate-shaped portion. The maximum thickness of the supported portion may be equal to or larger than a width of a clearance of the first support portion. In the second plate-shaped portion, in a state where at least a part of the supported portion contacts against the first support portion, the second plate-shaped portion may be inserted into the support portion with at least the penetration hole being arranged outside the support portion.

According to the above-described configuration, the second plate-shaped portion of the bus bar includes the terminal portion including the penetration hole penetrating in the thickness direction, and the supported portion including the projection portion protruding in the thickness direction of the second plate-shaped portion. Then, the terminal portion is arranged on the end side of the bus bar, and thus, the terminal portion (the penetration hole) and the supported portion (the projection portion) are arranged in this order from the end portion of the bus bar.

According to the above-described configuration, the support portion includes the first support portion, and the second support portion where the clearance is narrower than in the first support portion. At the time of inserting the second plate-shaped portion into the support portion, the terminal portion is inserted into the support portion from a side of the first support portion, and the supported portion including the projection portion is arranged in the first support portion, thereby the second plate-shaped portion is appropriately supported by the support portion. In the state where the second plate-shaped portion is inserted into the support portion, at least the penetration hole of the terminal portion is positioned outside the support portion, and for this reason, the penetration hole of the terminal portion needs to pass through the second support portion where the clearance is thinner than in the first support portion. Further, in the state where at least a part of the projection portion of the supported portion contacts against the first support portion, the terminal portion is in a state where at least the penetration hole is arranged outside the support portion, and for this reason, the shortest distance between the penetration hole and the projection portion is equal to or larger than a hole length of the support portion. Thereby, when the penetration hole of the terminal portion passes through the second support portion, the projection portion of the supported portion is not inserted into the support portion, and the projection portion of the supported portion contacts against the first support portion after the penetration hole completely passes through the second support portion. Accordingly, when the projection portion of the supported portion is inserted into the support portion (the first support portion), the penetration hole of the terminal portion is not affected by reaction force at the time that the projection portion contacts against an inner wall of the first support portion. For this reason, at least a periphery of the penetration hole of the terminal portion is not pressed or rubbed against an inner wall of the second support portion, and thus, the terminal portion is prevented from being scratched.

Further, in order to achieve the above-described advantageous effect, the following configurations may be adopted. Specifically, the magnetic core may include an arm portion formed of a magnetic material, and the pressing portion may press the arm portion by the convex portion.

Furthermore, the pressing portions may be each provided at a position associated with the arm portion, and the pressing portions may press the arm portions at a plurality of locations.

In addition, the beam portion may have elasticity, and by the convex portion of the pressing portion, reception of reaction force and pressing may be made in relation to the bus bar.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A current sensor comprising:
a bus bar through which measurement-target current flows and that includes a plate-shaped portion;
a magnetic core arranged so as to be along a circumferential direction of the plate-shaped portion and surround the plate-shaped portion; and
a casing that houses the bus bar and the magnetic core, wherein
the magnetic core is arranged in such a way that a thickness direction of the magnetic core is along a longitudinal direction of the plate-shaped portion,
the casing includes:
a lower casing that covers the plate-shaped portion and the magnetic core from a lower side; and
an upper casing that covers the plate-shaped portion and the magnetic core from an upper side and is fixed to the lower casing,
the lower casing includes:
a first press-fit portion including a groove portion into which the plate-shaped portion is press-fitted; and
a second press-fit portion by which, in a state where the magnetic core is inserted downward into the second press-fit portion, both-side portions of the magnetic core in a width direction are press-fitted and held,
the upper casing includes a pressing portion that presses the bus bar and the magnetic core downward,
the groove portion is a groove recessed downward, and is a groove along a thickness direction of the magnetic core, so that the groove portion has an opening facing a direction perpendicular to the longitudinal direction of the bus bar, and
the plate-shaped portion of the bus bar is press-fitted into the groove portion from above via the opening.

2. The current sensor according to claim 1, wherein
the first press-fit portion includes a pair of the grooves, and
a pair of the grooves are arranged on thickness-direction front and back sides of the magnetic core press-fitted into the second press-fit portion.

3. The current sensor according to claim 1, wherein
the pressing portion includes a beam portion including one end fixed to the upper casing, and a convex portion being provided on an opposite end side of the beam portion and protruding downward from a lower surface of the beam portion, and
the convex portion presses the bus bar and the magnetic core downward.

4. The current sensor according to claim 3, wherein
the magnetic core includes an arm portion formed of a magnetic material, and the pressing portion presses the arm portion by the convex portion.

5. The current sensor according to claim 4, wherein
the pressing portions are each provided at a position associated with the arm portion, and the pressing portions press the arm portions at a plurality of locations.

6. The current sensor according to claim 3, wherein
the beam portion has elasticity, and by the convex portion of the pressing portion, reception of reaction force and pressing are made in relation to the bus bar.

7. A current sensor comprising:
a bus bar through which measurement-target current flows and that includes a plate-shaped portion;
a magnetic core arranged so as to be along a circumferential direction of the plate-shaped portion and surround the plate-shaped portion; and
a casing that houses the bus bar and the magnetic core, wherein
the magnetic core is arranged in such a way that a thickness direction of the magnetic core is along a longitudinal direction of the plate-shaped portion,
the casing includes:
a lower casing that covers the plate-shaped portion and the magnetic core from a lower side; and
an upper casing that covers the plate-shaped portion and the magnetic core from an upper side and is fixed to the lower casing,
the lower casing includes:
a first press-fit portion including a groove portion into which the plate-shaped portion is press-fitted; and
a second press-fit portion by which, in a state where the magnetic core is inserted downward into the second press-fit portion, both-side portions of the magnetic core in a width direction are press-fitted and held,
the upper casing includes a pressing portion that presses the bus bar and the magnetic core downward,
the groove portion is a groove recessed downward, and is a groove along a thickness direction of the magnetic core,
the pressing portion includes a beam portion including one end fixed to the upper casing, and a convex portion being provided on an opposite end side of the beam portion and protruding downward from a lower surface of the beam portion,
the convex portion presses the bus bar and the magnetic core downward, and
an upper surface of the opposite end side of the beam portion that presses the bus bar is arranged at a position recessed so as to be on a lower side of an upper surface of the upper casing.

8. A current sensor comprising:
a bus bar through which measurement-target current flows and that includes a plate-shaped portion;
a magnetic core arranged so as to be along a circumferential direction of the plate-shaped portion and surround the plate-shaped portion; and
a casing that houses the bus bar and the magnetic core, wherein
the magnetic core is arranged in such a way that a thickness direction of the magnetic core is along a longitudinal direction of the plate-shaped portion,
the casing includes:
a lower casing that covers the plate-shaped portion and the magnetic core from a lower side; and
an upper casing that covers the plate-shaped portion and the magnetic core from an upper side and is fixed to the lower casing,
the lower casing includes:
a first press-fit portion including a groove portion into which the plate-shaped portion is press-fitted; and
a second press-fit portion by which, in a state where the magnetic core is inserted downward into the second press-fit portion, both-side portions of the magnetic core in a width direction are press-fitted and held,
the upper casing includes a pressing portion that presses the bus bar and the magnetic core downward,
the groove portion is a groove recessed downward, and is a groove along a thickness direction of the magnetic core,
the bus bar includes a second plate-shaped portion at one end,
the casing includes a support portion including a clearance that penetrates in a vertical direction and into which the second plate-shaped portion is inserted,
the support portion includes:
a first support portion; and
a second support portion where the clearance is narrower than in the first support portion,
the second plate-shaped portion includes:
a terminal portion that is arranged on an end side of the bus bar and that includes a penetration hole penetrating in a thickness direction of the second plate-shaped portion; and
a supported portion that includes a projection portion protruding in a thickness direction of the second plate-shaped portion,
a maximum thickness of the supported portion is equal to or larger than a thickness of the first support portion, and,
in the second plate-shaped portion, in a state where at least a part of the projection portion of the supported portion contacts against the first support portion, the second plate-shaped portion is inserted into the support portion with at least the penetration hole being arranged outside the support portion.

\* \* \* \* \*